(12) United States Patent
Drexler

(10) Patent No.: US 6,414,540 B2
(45) Date of Patent: Jul. 2, 2002

(54) INPUT FILTER STAGE FOR A DATA STREAM, AND METHOD FOR FILTERING A DATA STREAM

(75) Inventor: Michael Drexler, Gehrden (DE)

(73) Assignee: Deutsche Thomson-Brandt GmbH, Villingen-Schwenningen (DE)

( * ) Notice: Subject to any disclaimer, the term of this patent is extended or adjusted under 35 U.S.C. 154(b) by 0 days.

(21) Appl. No.: 09/737,077

(22) Filed: Dec. 14, 2000

(30) Foreign Application Priority Data

Dec. 16, 1999 (DE) .......................... 199 60 785

(51) Int. Cl.$^7$ ................................ H04B 1/10
(52) U.S. Cl. ...................... 327/552; 327/551
(58) Field of Search ................ 327/551, 552, 327/553, 556, 555, 310, 34, 35

(56) References Cited

U.S. PATENT DOCUMENTS

| | | | | |
|---|---|---|---|---|
| 5,001,374 A | * | 3/1991 | Chang ....................... | 327/552 |
| 5,059,834 A | * | 10/1991 | Tago et al. ................. | 327/310 |
| 5,386,159 A | * | 1/1995 | Dupre ........................ | 327/551 |
| 5,663,675 A | * | 9/1997 | O'Shaughnessy .......... | 327/553 |
| 6,211,724 B1 | * | 4/2001 | Kwon ....................... | 327/551 |

FOREIGN PATENT DOCUMENTS

| | | |
|---|---|---|
| DE | 4220557 A1 | 1/1994 |
| EP | 0664612 A1 | 7/1995 |

* cited by examiner

*Primary Examiner*—Kenneth B. Wells
*Assistant Examiner*—Linh Nguyen
(74) *Attorney, Agent, or Firm*—Joseph S. Tripoli; Paul P. Kiel

(57) ABSTRACT

An input filter stage and to a method for filtering a data stream. The input filter stage comprises a register chain, which is connected to an input line and has a plurality of series-connected registers, and a switching device connected to an output line and to the register chain in order to switch the output line, a signal input of a first register in the register chain being connected to the input line, and a signal input of a subsequent register in the register chain being connected to a respective signal output of a preceding register in the register chain, a clock input for the plurality of registers being connected to a respective clock line which can be used to transmit a sampling signal at a sampling frequency, the sampling frequency being higher than a maximum data transmission frequency of the data stream, and the switching device being connected to the register chain such that the output line can be switched to a logic level of the signal outputs of the plurality of registers when output signals which are produced at each of the signal outputs of the plurality of registers are at the same logic level.

9 Claims, 1 Drawing Sheet

INPUT FILTER STAGE FOR A DATA STREAM, AND METHOD FOR FILTERING A DATA STREAM

BACKGROUND OF THE INVENTION

The invention relates to an input filter stage for a data stream, to an I2C bus interface, to an integrated circuit and to a method for filtering a data stream.

During serial data transmission operations, particularly during data transmission via unscreened lines, as in the case of the I2C bus system, for example, interference frequently arises in the signals. This interference is, by way of example, voltage spikes and interference pulses caused by crosstalk or reflection or by electromagnetic influence.

Particularly when no suitable termination of the bus is provided, line reflections are customary in an I2C bus system, in which a changing number of input interfaces can additionally be connected. Furthermore, long line paths can additionally make the bus more difficult to tune if not all of the input stages are located on a printed circuit board.

Input filter stages are used to suppress such interference. The input stages used are frequently Schmitt triggers, which ignore signal fluctuations below or above particular threshold values and therefore pass on only clearly detectable signal level changes to the logic connected downstream. Such circuits are frequently used for "debouncing" keys on keyboards, for example.

However, a Schmitt trigger has the disadvantage that interference pulses and voltage spikes which have amplitude values higher than the signals are rated as signals and are then erroneously passed on to the logic connected downstream.

SUMMARY OF THE INVENTION

It is the object of the invention to provide an input filter stage and a method for filtering a data stream supplied via an input line in which interference, particularly interference pulses and voltage spikes, is reliably filtered out, the aim being for the circuit complexity for the input filter stage to be as low as possible.

This object is achieved by the features specified in the independent claims.

The invention provides an input filter stage for filtering a data stream which has a register chain, which is connected to an input line and has a plurality of series-connected registers, and a switching device connected to an output line and to the register chain in order to switch the output line, a signal input of a first register in the register chain being connected to the input line, and a signal input of a subsequent register in the register chain being connected to a respective signal output of a preceding register in the register chain, a clock input for the plurality of registers being connected to a respective clock line which can be used to transmit a sampling signal at a sampling frequency, the sampling frequency being higher than a maximum data transmission frequency of the data stream, and the switching device being connected to the register chain such that the output line can be switched to a logic level of the signal outputs of the plurality of registers when output signals which are produced at each of the signal outputs of the plurality of registers are at the same logic level.

The essential advantage obtained by the invention over the prior art is that little circuit complexity is used to provide a possibility for suppressing interference on bus lines in data streams, particularly for suppressing interference which occurs as a result of line reflections or crosstalk.

The method disclosed can be applied to any interference-affected signal line which is sampled using a clock whose frequency is higher than the data transmission frequency in the data stream.

In one embodiment of the invention, provision may be made for the plurality of registers each to be in the form of D-type flip-flops in the context of a shift register.

One advantageous development of the invention provides that the register chain comprises three registers, which means that only a minimum level of circuit complexity is required.

Provision is expediently made for the sampling frequency to be a plurality of times higher than the maximum frequency of the data transmission, preferably to be approximately 50 MHz, which improves the quality of the interference elimination.

In one development of the invention, the circuit device comprises an AND gate, a NOR gate and a further register, inputs of the AND gate and of the NOR gate each being connected to the signal output of one of the plurality of registers, and outputs of the AND gate and of the NOR gate each being connected to inputs of the further register. This allows the circuit device to be formed using simple logic gates.

The filter input stage according to the invention may advantageously be used in an I2C bus system or in an integrated circuit.

The method claims, correspondingly, have the advantages cited in the context of the apparatus claims.

In the case of the method, provision may expediently be made for the output line to be switched by means of the SR-type flip-flop, an S-input of the SR-type flip-flop assuming a logic "1" level only when the same logic level of the signal outputs of the registers is a logic "1" level, and an R-input of the SR-type flip-flop assuming a logic "1" level only when the same logic level of the signal outputs of the registers is a logic "0" level.

BRIEF DESCRIPTION OF THE DRAWING

An illustrative embodiment of the invention is described below with the aid of a drawing, in which.

DESCRIPTION OF THE PREFERRED EMBODIMENTS

Figure 1:
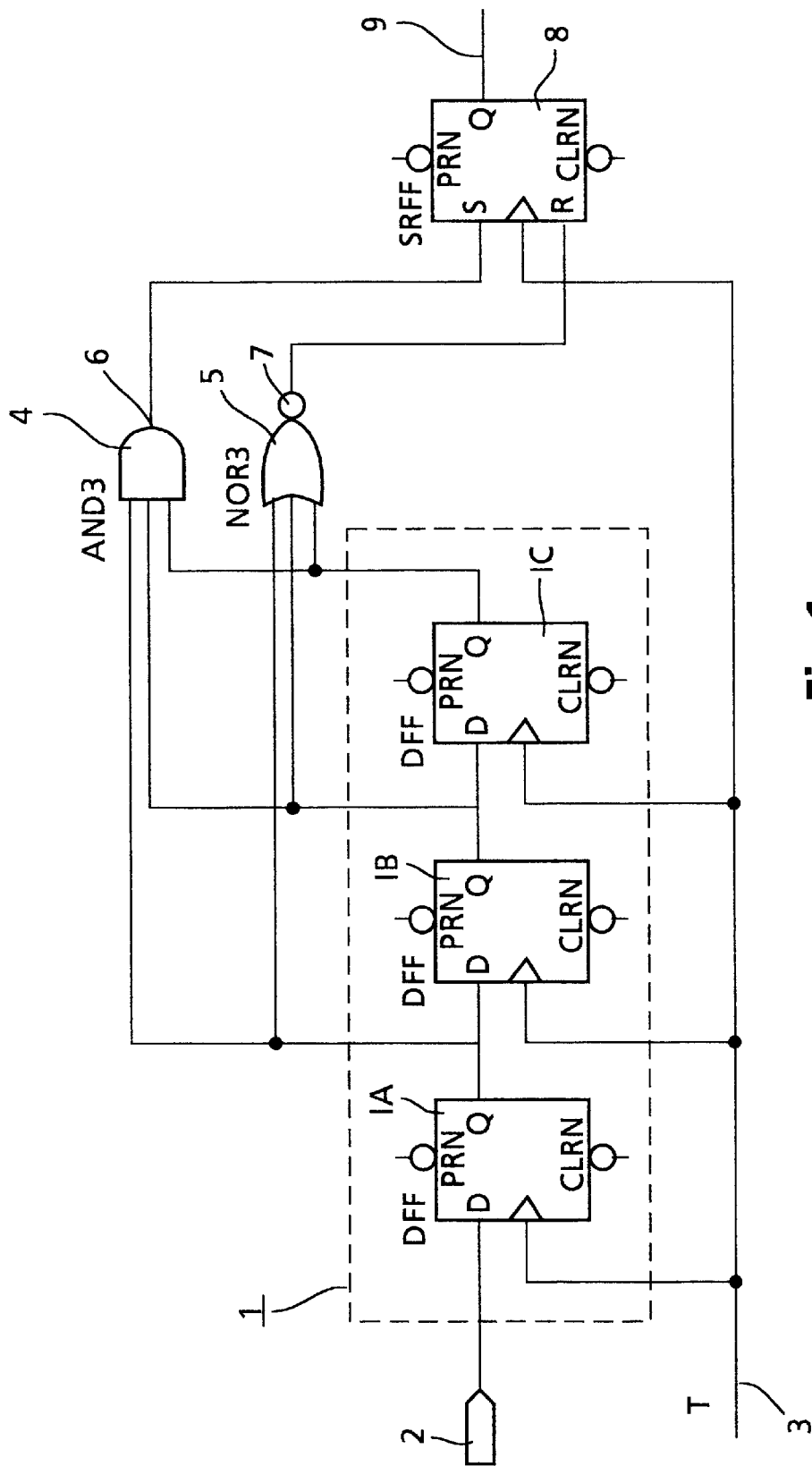
FIG. 1 shows a schematic illustration of an input filter stage.

FIG. 1 shows an embodiment of the invention in which a register chain 1 comprises three registers 1A, 1B and 1C connected in succession. Connected to an input D1A of a first register 1A is an input line 2 which is used to transmit a serial data stream. A noninverting output Q1A of the first register 1A is connected to an input D1B of a second register 1B; the output Q2B of the latter is connected to an input D1C of a third register 1C in the register chain 1. Each register in the register chain 1 is connected to a clock line 3, which is used to transmit a sampling clock signal T.

The noninverting outputs Q1A, Q1B, Q1C of the registers 1A, 1B, 1C are each connected to inputs of an AND gate 4 and of a NOR gate 5. An output 6 of the AND gate 4 and an output 7 of the NOR gate 5 are each connected to a further register 8, to which an output line 9 is connected.

The AND gate 4, the NOR gate 5 and the further register 8 together form a switching device for switching a logic level on the output line 9. The output 6 of the AND gate 4 switches to a "1" level only when the outputs Q1A, Q1B, Q1C of all three registers 1A, 1B, 1C have a logic "1" level.

Likewise, the output 7 of the NOR gate 5 switches to a logic "1" level only when all the outputs Q1A, Q1B, Q1C of the registers 1A, 1B, 1C are at the logic "0" level.

The output 6 of the AND gate 4 is connected to an S-input of the further register 8, which is in the form of an SR-type flip-flop. The output 7 of the NOR gate 5 is connected to an R-input of the SR-type flip-flop. The further register 8, which is in the form of an SR-type flip-flop, is clocked by means of the sampling clock signal T, in the same way as the three registers 1A, 1B, 1C in the register chain 1.

If the S-input of the SR-type flip-flop 8 assumes a "1" level, the output signal from the input filter stage is switched to logic "1" upon the next clock signal edge. If the R-input of the SR-type flip-flop 8 assumes a logic "1" level, the output signal is reset to "0" upon the next clock signal edge. If the S-input and the R-input both have a logic "0", the output signal maintains the previous value (value stored for the preceding clock signal edge of the sampling clock signal T).

The state in the SR-type flip-flop 8 in which both the S-input and the R-input assume a logic "1" level does not arise, because the AND gate 4 and the NOR gate 5 each receive the same input signals, and therefore always deliver one "1" level for various input conditions. If the output 6 of the AND gate 4 has a "1", the output 7 of the NOR gate 5 can never have a "1".

If the signal level of the input signal changes from "0" to "1", this logic "1" level is transferred to the first register 1A in the register chain 1 with the next rising edge of the sampling clock signal T, i.e. the logic level at the output Q1A of the first register changes from "0" to "1". Since this output Q1A is connected to the input D1B of the second register 1B, the logic "1" level is transferred to the second register 1B with the next rising edge of the sampling clock signal T. This continues until all the registers 1A, 1B, 1C in the register chain 1 store the logic "1" level, provided that the input signal does not change during this time.

Since a frequency of the sampling clock signal T is a plurality of times higher than a frequency of the serial data transmitted via the input line 2, and hence changes in the serial data or in the input signal based thereon are very much slower than changes in the sampling clock signal T, a logic "1" is generally applied to the input if the signal profile is not subject to interference. After three rising edges of the sampling clock signal T, this logic "1" has been transferred into the three registers 1A, 1B, 1C in the register chain 1. The outputs Q1A, Q1B, Q1C thereof each have a logic "1" level.

With the change of the output Q1C of the third register 1C in the register chain 1 from logic "0" to logic "1", the output 6 of the AND gate 4 changes to "1". As a result of this, a "1" is applied to the S-input of the SR-type flip-flop 8 and, with the next rising edge of the sampling clock signal T, connects the logic "1" level to the output of the SR-type flip-flop 8, i.e. the level change in the input signal on the input line 2 from "0" to "1" is passed on to the output of the RS-type flip-flop 8 after four rising edges of the sampling clock signal T.

If the level of the input signal changes in the opposite direction from "1" to "0", this "0" level is transferred into the registers 1A, 1B, 1C in the register chain 1 within three rising edges of the sampling clock signal T, in the same way. As soon as there is a logic "0" at all three outputs Q1A, Q1B, Q1C of the registers, the NOR gate 5 switches its output 7 to the logic "1" level, and a "1" is applied to the R-input of the SR-type flip-flop 8 and, with the next rising edge of the sampling clock signal T, resets the SR-type flip-flop 8, so that the output signal changes from "1" to the "0". The change in the input signal from "1" to "0" is thus likewise transferred within four rising edges of the sampling clock signal T.

The frequency of the sampling clock signal T is preferably a multiple of the frequency of the input signal (of the serial data), with the result that no significant delays arise between an input signal change and the change in the output signal. In the case of the embodiment described, any signal pulse which is smaller than the threefold clock period of the sampling clock signal T is not passed on to the output. Since the frequency of the input signals is very much lower than that of the sampling clock signal T, such short pulses are usually just interference pulses or voltage spikes, which are unwanted must not be passed on to the output of the input filter stage.

The register chain 1, having three registers 1A, 1B, 1C connected in succession, which is used in the embodiment described above serves to illustrate the principle of the invention. Naturally, the register chain 1 can also comprise more than three registers. The register chain 1 and the frequency of the sampling clock signal T need to be tuned such that the register chain 1 is long enough to filter the longest reflections or interference out of the input signal without suppressing valid data signals in the process. In this context, the maximum duration of an interference signal filtered out by an input filter is obtained from multiplying the number of registers in the register chain 1 by the clock period of the sampling clock signal T.

An input filter can thus be configured for any desired area. This is done when designing the input filter, first by choosing a suitable number of registers for the register chain 1. Secondly, the frequency of the sampling clock signal T is selected. For this, it should be noted that the larger the interference pulses which are able to be suppressed by this input filter, the greater the delay also in the input filter between the input signal and the output signal.

In the embodiment described, the registers in the register chain 1 are in the form of D-type flip-flops. However, it is also possible to use other register types or switching elements suitable for constructing a shift register.

The AND gate 4, the NOR gate 5 and the SR-type flip-flop 8 together form one possible switching apparatus for switching the output line 9 to the logic level of the registers 1A, 1B, 1C in the register chain 1 when the outputs Q1A, Q1B, Q1C of all three registers 1A, 1B, 1C have assumed either a "1" level or a "0" level. Such a switching apparatus can naturally also be produced using other switching elements if the logic function on which the is based is retained. The essential feature here is that the output signal level of the input filter changes only when a change in the input signal affects all the outputs Q1A, Q1B, Q1C of the registers 1A, 1B, 1C in the register chain 1.

The input filter stage described can be used in an I2C bus system, for example. Since, in the I2C bus, serial data is usually transmitted via unscreened lines, the transmission rates are limited. By way of example, the maximum frequency of the input signals in the embodiment described above is 400 kHz and the sampling clock rate is 50 MHz. Any interference pulse of less than 3×20 ns is filtered out by this input filter stage. This input filter stage can naturally be used to filter serial data streams irrespective of the particular transmission protocol and irrespective of the data frequency.

The digital circuit shown schematically in FIG. 1 can be produced with little outlay and can preferably be formed, together with logic connected downstream or an evaluation circuit, on an integrated circuit. The additional hardware involvement as a result of the input filter is negligibly low by comparison with today's chip sizes.

To implement the invention in its various embodiments, the invention's features disclosed in the description above, the claims and the drawing can be an essential part both individually and in any desired combination.

The use of the invention has been explained for the I2C bus by way of example. This is a bus which is used to transmit the data words serially. The invention may also be used in bus systems in which the data words are transmitted in parallel, however. In this case, the register chain mentioned needs to be provided for each individual data line.

What is claimed is:

1. Input filter stage for filtering a data stream supplied via an input line, comprising:
   a register chain connected to the input line and has a plurality of series-connected registers;
   a switching device connected to an output line and to the register chain in order to switch the output line, the switching device comprising an AND gate, a NOR gate and a further register, the inputs of the AND gate and the NOR gate each being connected to the signal output of one of the plurality of registers, and the outputs of the AND gate and the NOR gate each being connected to inputs of the further register;
   a signal input of a first register in the register chain being connected to the input line, and a signal input of a subsequent register in the register chain being connected to a respective signal output of a preceding register in the register chain;
   a clock input for the plurality of registers being connected to a respective clock line which can be used to transmit a sampling signal at a sampling frequency, the sampling frequency being higher than a maximum data transmission frequency of the data stream, the switching device being connected to the register chain such that the output line can be switched to a logic level of the signal outputs of the plurality of registers when output signals which are produced at each of the signal outputs of the plurality of registers are at the same logic level.

2. Input filter stage according to claim 1, wherein the plurality of registers are each in the form of D-type flip-flops.

3. Input filter stage according to claim 1, wherein the register chain comprises three registers.

4. Input filter stage according to claim 1, wherein the sampling frequency is a plurality of times higher than the maximum data transmission frequency of the data stream.

5. Input filter stage according to claim 1, wherein the sampling frequency is approximately 50 MHz.

6. Input filter stage according to claim 1, wherein the further register is in the form of an SR-type flip-flop.

7. Method for filtering a data stream in a filter input stage which comprises a serial register chain, connected to an input line, and a switching device, connected to the serial register chain and to an output line, the method comprising the steps of:
   providing a switching device comprising an SR-type flip-flop, wherein the output line is switched by means of the SR-type flip-flop, an S-input of the SR-type flip-flop assumes a logic "1" level only when the same logic level of the signal outputs of the registers is a logic "1" level, and an R-input of the SR-type flip-flop assumes a logic "1" level only when the same logic level of the signal outputs of the registers is a logic "0" level;
   serially transferring the data using the serial register chain, the registers in the serial register chain being clocked at a sampling frequency which is higher than a maximum data transmission frequency of the data stream; and
   using the switching device to switch the output line to a logic output level when signal outputs of the registers in the serial register chain are at the same logic level.

8. Method according to claim 7, wherein the sampling frequency is a plurality of times higher than the maximum data transmission frequency of the data stream on the input line.

9. Method according to claim 7, wherein the sampling frequency is approximately 50 MHz.

* * * * *